United States Patent
Shih et al.

(10) Patent No.: US 9,105,582 B2
(45) Date of Patent: Aug. 11, 2015

(54) SPATIAL SEMICONDUCTOR STRUCTURE AND METHOD OF FABRICATING THE SAME

(71) Applicant: UNITED MICROELECTRONICS CORPORATION, Hsinchu (TW)

(72) Inventors: Hung-Lin Shih, Hsinchu (TW); Chih-Chien Liu, Taipei (TW); Jei-Ming Chen, Tainan (TW); Wen-Yi Teng, Kaohsiung (TW); Chieh-Wen Lo, Tainan (TW)

(73) Assignee: United Microelectronics Corporation, Hsinchu (TW)

( * ) Notice: Subject to any disclaimer, the term of this patent is extended or adjusted under 35 U.S.C. 154(b) by 64 days.

(21) Appl. No.: 13/968,392

(22) Filed: Aug. 15, 2013

(65) Prior Publication Data
US 2015/0048486 A1    Feb. 19, 2015

(51) Int. Cl.
*H01L 21/76* (2006.01)
*H01L 29/06* (2006.01)
*H01L 21/308* (2006.01)

(52) U.S. Cl.
CPC .............. *H01L 21/308* (2013.01); *H01L 29/06* (2013.01)

(58) Field of Classification Search
CPC ............................. H01L 21/308; H01L 29/06
See application file for complete search history.

(56) References Cited

U.S. PATENT DOCUMENTS

| | | | |
|---|---|---|---|
| 6,043,138 A | 3/2000 | Ibok | |
| 6,066,533 A * | 5/2000 | Yu | 438/275 |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,268,058 B2 | 9/2007 | Chau | |
| 7,309,626 B2 | 12/2007 | Ieong | |
| 7,326,634 B2 | 2/2008 | Lindert | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Simon | |
| 8,192,219 B2 * | 6/2012 | Satoh | 439/328 |
| 8,389,391 B2 | 3/2013 | Chambers | |
| 2004/0195624 A1 | 10/2004 | Liu | |
| 2005/0051825 A1 | 3/2005 | Fujiwara | |
| 2005/0275035 A1 * | 12/2005 | Mathew et al. | 257/369 |
| 2006/0099830 A1 | 5/2006 | Walther | |
| 2006/0286729 A1 | 12/2006 | Kavalieros | |
| 2007/0108528 A1 | 5/2007 | Anderson | |
| 2007/0158756 A1 | 7/2007 | Dreeskornfeld | |
| 2008/0157208 A1 | 7/2008 | Fischer | |
| 2009/0124097 A1 | 5/2009 | Cheng | |

(Continued)

*Primary Examiner* — Long K Tran
(74) *Attorney, Agent, or Firm* — Ding Yu Tan

(57) ABSTRACT

A method of fabricating a spatial semiconductor structure includes steps as follows. Firstly, a semiconductor substrate is provided. Then, a first mask layer is formed above the semiconductor substrate. Then, at least a first opening is formed in the first mask layer and exposes a portion of a surface of the semiconductor substrate. Then, a first semiconductor pattern is formed in the first opening. Then, a second mask layer is formed over the first semiconductor pattern and the first mask layer. Then, at least a second opening is formed through the second mask layer to the first mask layer and exposes another portion of the surface of the semiconductor substrate. And, a second semiconductor pattern is formed in the second opening.

8 Claims, 2 Drawing Sheets

(56) References Cited

U.S. PATENT DOCUMENTS

| | | |
|---|---|---|
| 2009/0242964 A1 | 10/2009 | Akil |
| 2009/0269916 A1 | 10/2009 | Kang |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |

* cited by examiner

US 9,105,582 B2

SPATIAL SEMICONDUCTOR STRUCTURE AND METHOD OF FABRICATING THE SAME

FIELD OF THE INVENTION

The present invention relates to a semiconductor structure and a method of fabricating the same, and more particularly to a spatial semiconductor structure and a method of fabricating the same.

BACKGROUND OF THE INVENTION

In the sub-nanometer generation of fabrication process of a semiconductor device, one demand is to shrink a size of the semiconductor device and to obviate a short channel effect therein, and another demand is to increase a response speed and to reduce power consumption thereof. In order to meet the above demands, a semiconductor device having a broader channel width such as a FIN field effect transistor (FINFET) is a solution. However, in the case of obtaining a functional circuit that needs to fabricate semiconductor devices formed in a substrate having differentiated spatial channel width from others, such as a complementary metal-oxide-semiconductor (CMOS) transistor, one aspect is to maintain a pattern integrity of the spatial channels of the semiconductor devices, and another aspect is to form uniformly doped regions in spatial channels having high aspect ratios and prevent leakage thereof.

Therefore, there is a need of providing an improved method of fabricating semiconductor devices having differentiated channel widths.

SUMMARY OF THE INVENTION

In accordance with an aspect, the present invention provides a method of fabricating a spatial semiconductor structure including steps as follows. Firstly, a semiconductor substrate is provided. Then, a first mask layer is formed above the semiconductor substrate. Then, at least a first opening is formed in the first mask layer and exposes a portion of a surface of the semiconductor substrate. Then, a first semiconductor pattern is formed in the first opening. Then, a second mask layer is formed over the first semiconductor pattern and the first mask layer. Then, at least a second opening is formed through the second mask layer to the first mask layer and exposes another portion of the semiconductor substrate. Then, a second semiconductor pattern is formed in the second opening.

In accordance with another aspect, the present invention provides a spatial semiconductor structure including a semiconductor substrate, at least a first semiconductor pattern and at least a second semiconductor pattern. The first semiconductor pattern and the second semiconductor pattern are respectively formed on the semiconductor substrate, wherein a height of the second semiconductor pattern is greater than a height of the second semiconductor pattern.

In accordance with the present invention, after the first semiconductor pattern is formed in the first opening and covered by the second mask layer, the second opening is formed through the second mask layer to the first mask layer, and the second semiconductor pattern is formed in the second opening. Moreover, according to an embodiment of the present invention, the height of the second semiconductor pattern may be obtained by means such as adjusting a thickness of the second mask layer formed over the first mask layer. Consequently, the first semiconductor pattern and the second semiconductor pattern having differentiated heights can be used for fabricating spatial semiconductor devices having high electrical performances.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Firstly, FIGS. 1A-1F are schematic cross-sectional views illustrating a partial process flow of a method of fabricating a spatial semiconductor structure and a spatial semiconductor structure according to an embodiment of the present invention.

Figure 1A:
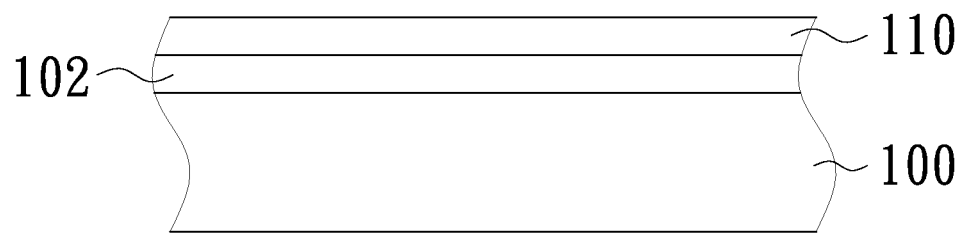
FIGS. 1A-1F are schematic cross-sectional views illustrating a partial process flow of a method of fabricating a spatial semiconductor structure according to an embodiment of the present invention.

Please refer to FIG. 1A, a semiconductor substrate 100 is provided, and a first mask layer 110 is formed above the semiconductor substrate 100. The semiconductor substrate 100 can be made of material selected from bulk silicon (Si) substrate, silicon on insulator (SOI), germanium (Ge) substrate, silicon/germanium substrate or other semiconductor substrate with P-doped, N-doped or intrinsic semiconductor, but not limited thereto in the present invention. In this embodiment, the semiconductor substrate 100 is a silicon substrate. Before the first mask layer 110 is formed above the semiconductor substrate 100, the semiconductor substrate 100 includes an insulation layer 102 formed thereon, and the first mask layer 110 is formed on the insulation layer 102, wherein a material for forming the first mask layer 110 has an etching selectivity with respect to a material for forming the insulation layer 102. For example, the material of the insulation layer 102 is silicon oxide, and the material of the first mask layer 110 is silicon nitride.

Figure 1B:
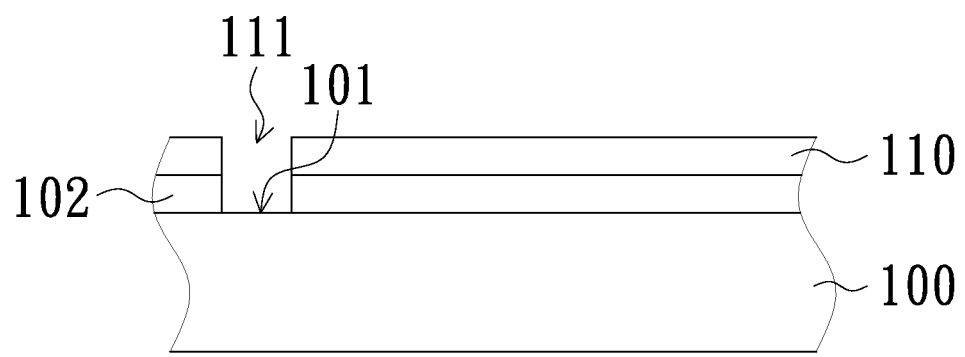

Then, as shown in FIG. 1B, at least a first opening 111 is formed in the first mask layer 110 and the insulation layer 102. The first opening 111 may be selectively formed by a conventional lithography-etching process including steps of forming a photoresist pattern layer (not shown) on the first mask layer 110, followed by exposing a portion of the first mask layer 110, and sequentially removing the exposed portion of the first mask layer 110 and a portion of the insulation layer 102 thereby exposing a portion of a surface 101 of the semiconductor substrate 100.

Figure 1C:
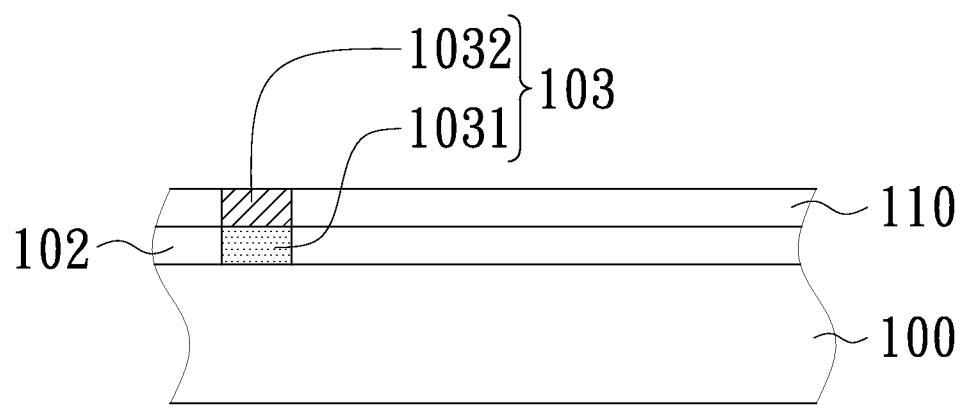

Then, as shown in FIG. 1C, a first semiconductor pattern 103 is formed in the first opening 111. The first semiconductor pattern 103 may be selectively formed by performing an epitaxial process or a deposition process, wherein a preferred process is the epitaxial process that a uniform lattice in the first semiconductor pattern 103 may be obtained according to a lattice plane of the surface 101 of the semiconductor substrate 100 having a single crystalline structure. A material of the first semiconductor pattern 103 may be same as or different from the material of the semiconductor substrate 100. In this embodiment, the material of the first semiconductor pattern 103 is silicon, which is same as the material of the semiconductor substrate 100. It is noted that due to a high aspect ratio of a spatial channel of a FINFET, a uniform doped region can not be easily formed in the spatial channel thereof by performing a conventional ion-implantation process. In the present invention, a first doped region 1031 and a second doped region 1032 can be sequentially formed in the first semiconductor pattern 103 by in-situ doping dopants of a first conductive type and a second conductive type during the epitaxial process of forming the first semiconductor pattern 103, wherein the second doped region 1032 is formed atop the first doped region 1031. Therefore, a doping uniformity of dopants over the first semiconductor pattern 103 can be obtained.

Figure 1D:
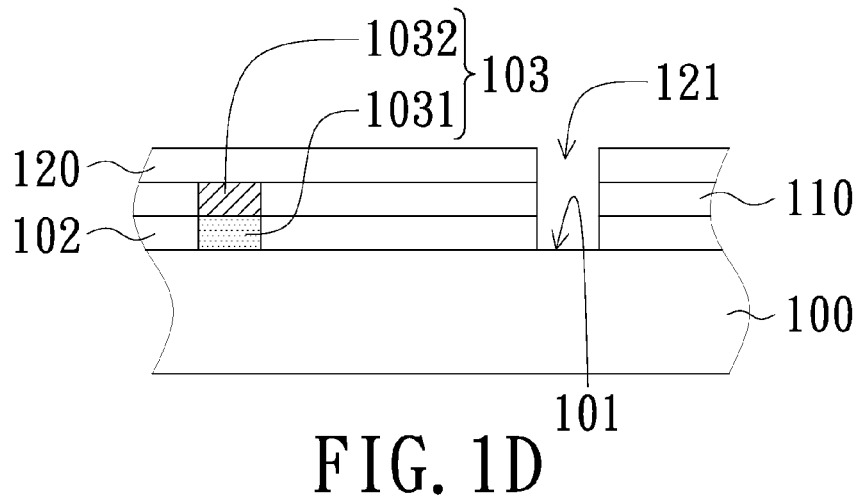

Then, as shown in FIG. 1D, a second mask layer 120 is formed over the first semiconductor pattern 103 and the first mask layer 110. A material of the second mask layer 120 can be the same as the material of the first mask layer 110, for example, silicon nitride. Then, at least a second opening 121 is formed through the second mask layer 120 and the first mask layer 110 to the insulation layer 102, and exposes another portion of the surface 101 of the semiconductor substrate 100. The second opening 121 may be formed by performing the conventional lithography-etching process as the above description of forming the first opening 111, and the conventional lithography-etching process is not redundantly mentioned herein.

Figure 1E:
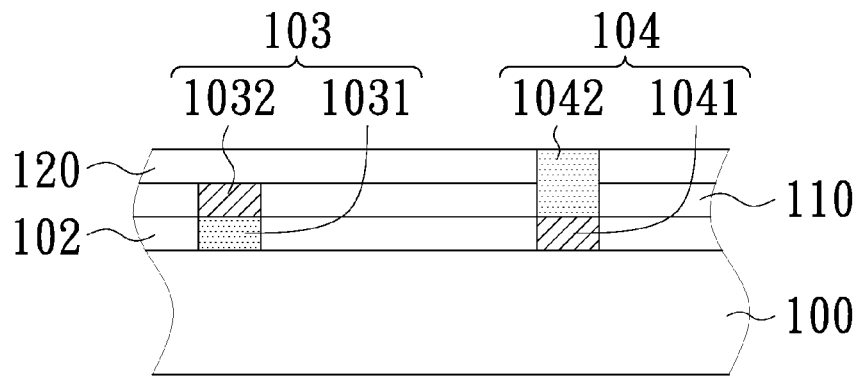

Then, as shown in FIG. 1E, a second semiconductor pattern 104 is formed in the second opening 121. In this embodiment, the second semiconductor pattern 104 is formed on the exposed portion of the surface 101 of the semiconductor substrate 100 by performing another epitaxial process in combination of another in-situ doping process same as the epitaxial process of forming the first semiconductor pattern 103 and the in-situ doping process of forming the first doped region 1031 and the second doped region 1032. Therefore, a third doped region 1041 having dopants of the second conductive type and a fourth doped region 1042 having dopants of the first conductive type are sequentially formed in the second semiconductor pattern 104, wherein the fourth doped region 1042 is formed atop the third doped region 1041.

It is noted that a height of the second semiconductor pattern 104 may be adjusted by different means, such as: adjusting a thickness of the second mask layer 120 formed over the first mask layer 110; tuning a process time of the epitaxial process of forming the second semiconductor pattern 104 in the second opening 121; or decreasing the thickness of the second mask layer 120 and the second semiconductor pattern 104 with a chemical-mechanical polishing process, so that a differentiated height between the first semiconductor pattern 103 and the second semiconductor pattern 104 can be obtained. Additionally, a line width of the second semiconductor pattern 104 can be the same as or different from a line width of the first semiconductor pattern 103.

Figure 1F:
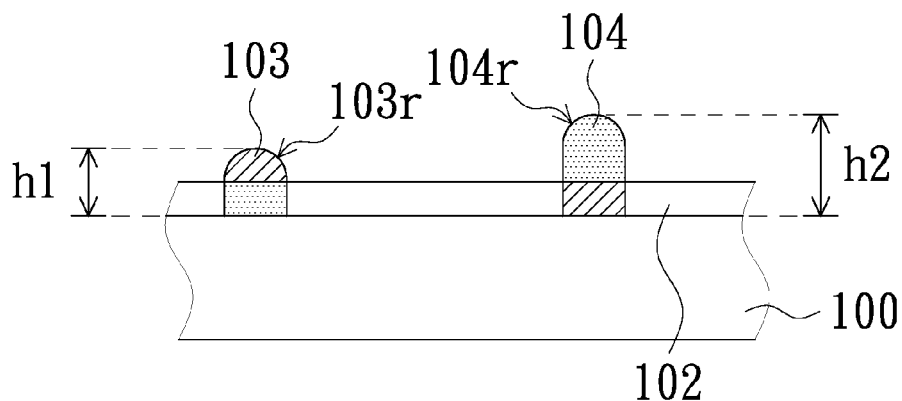

Then, as shown in FIG. 1F, the first mask layer 110 and the second mask layer 120 are sequentially removed, with the insulation layer 102 as a stop layer, so that a portion of the first semiconductor pattern 103 and a portion of the second semiconductor pattern 104 are exposed. The first semiconductor pattern 103 and the second semiconductor pattern 104 which have differentiated heights can be respectively used for fabricating FINFETs of different conductive types. In the instant specification and disclosure, the height of the semiconductor pattern is a distance measurement from the surface 101 of the semiconductor substrate 100 to the highest point of the corresponding semiconductor pattern. In this embodiment, the first conductive type is N-type, and the second conductive type is P-type. The insulation layer 102 can be used to electrically isolate the first semiconductor pattern 103 and the second semiconductor pattern 104. In detail, the first semiconductor pattern 103 having a lower height h1 can be used for fabricating an N-type FINFET, wherein the first doped region 1031 of N-type can be used as a punch through stop layer to prevent a leakage, and the second doped region 1032 can be used as a P-well of the N-type FINFET; the second semiconductor pattern 104 having a greater height h2 can be used for fabricating a P-type FINFET, wherein the third doped region 1041 of P-type can be used as a punch through stop layer to prevent a leakage, and the fourth doped region 1042 of N-type can be used as a N-well of the P-type FINFET. Moreover, the N-type FINFET fabricated with the first semiconductor pattern 103 and the P-type FINFET fabricated with the second semiconductor pattern 104 can be combined to fabricate a CMOS transistor having higher electrical performance. Since the border of fins of the FINFET, e.g. the second doped region 1032 and the fourth doped region 1042, is viewed as effective channel width of the FINFET, the N-type FINFET and the P-type FINFET may have different channel widths according to the present invention for their different driven requirements. However, it is not limited to the application of fabricating the semiconductor device having semiconductor patterns with differentiated heights. For example, the heights of the semiconductor patterns may be adjusted to substantially the same.

Additionally, to avoid electron/hole carriers concentrating at a sharp corner of the spatial channel (i.e. the exposed portion of the first semiconductor pattern 103 or the second semiconductor pattern 104), sharp corners of the exposed portion of the first semiconductor pattern 103 and the second semiconductor pattern 104 can be modified with a chemical solution, such as a sulfuric acid solution, to form a plurality of arc shapes 103r and 104r (marked as arrow symbols in FIG. 1F) on the exposed portion of the surface of the first semiconductor pattern 103 and the exposed portion of the surface of the second semiconductor pattern 104, respectively.

According to the above description, the present invention provides a spatial semiconductor structure and a method of fabricating the same, after the first semiconductor pattern is formed in the first opening and covered by the second mask layer, the second opening is formed through the second mask layer to the first mask layer, and the second semiconductor pattern is formed in the second opening. Moreover, according to an embodiment of the present invention, the semiconductor patterns having differentiated heights may be obtained by means such as adjusting a thickness of the second mask layer formed over the first mask layer. Consequently, the first semiconductor pattern and the second semiconductor pattern having differentiated heights can be used for fabricating spatial semiconductor devices having higher electrical performances.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of fabricating a spatial semiconductor structure, comprising steps as follows:

providing a semiconductor substrate, wherein the semiconductor substrate is made of bulk silicon (Si) substrate, silicon on insulator (SOI), germanium (Ge) substrate or silicon/germanium substrate;

forming a first mask layer above the semiconductor substrate;

forming at least a first opening in the first mask layer and exposing a portion of a surface of the semiconductor substrate;

forming a first semiconductor pattern in the first opening;

forming a second mask layer over the first semiconductor pattern and the first mask layer;

forming at least a second opening through the second mask layer to the first mask layer and exposing another portion of the surface of the semiconductor substrate; and forming a second semiconductor pattern in the second opening.

2. The method of fabricating the spatial semiconductor structure according to claim 1, before the step of forming the first mask layer above the semiconductor substrate, forming an insulation layer on the surface of the semiconductor substrate, wherein the step of forming the first opening comprises sub-steps of forming the first mask layer on the insulation layer, removing a portion of the first mask layer and a portion of the insulation layer, and exposing the portion of the surface of the semiconductor substrate.

3. The method of fabricating the spatial semiconductor structure according to claim 2, wherein a material for forming the first mask layer has an etching selectivity with respect to a material for forming the insulation layer.

4. The method of fabricating the spatial semiconductor structure according to claim 1, wherein the steps of forming the first semiconductor pattern and the second semiconductor pattern are respectively performed with a first epitaxial process and a second epitaxial process.

5. The method of fabricating the spatial semiconductor structure according to claim 4, wherein the first epitaxial process further comprises:

in-situ doping the first semiconductor pattern to form a first doped region and a second doped region, the second doped region being formed atop the first doped region; and the second epitaxial process further comprises:

in-situ doping the second semiconductor pattern to form a third doped region and a fourth doped region, the fourth doped region being formed atop the third doped region.

6. The method of fabricating the spatial semiconductor structure according to claim 5, wherein the first doped region and the fourth doped region have dopants of a first conductive type, and the second doped region and the third doped region have dopants of a second conductive type.

7. The method of fabricating the spatial semiconductor structure according to claim 1, wherein a height of the second semiconductor pattern is greater than a height of the first semiconductor pattern.

8. The method of fabricating the spatial semiconductor structure according to claim 1, further comprising steps of:

removing the first mask layer and the second mask layer, and exposing a portion of a surface of the first semiconductor pattern and a portion of a surface of the second semiconductor pattern; and modifying the first semiconductor pattern and the second semiconductor pattern with a chemical solution to form arc shapes on the exposed portion of the surface of the first semiconductor pattern and the exposed portion of the surface of the second semiconductor pattern, respectively.

* * * * *